United States Patent [19]
Sakamoto

[11] Patent Number: 5,837,938
[45] Date of Patent: Nov. 17, 1998

[54] ELECTRIC CONNECTION BOX

[75] Inventor: Masami Sakamoto, Shizuoka, Japan

[73] Assignee: Yazaki Corporation, Tokyo, Japan

[21] Appl. No.: 896,965

[22] Filed: Jul. 18, 1997

[30] Foreign Application Priority Data

Jul. 19, 1996 [JP] Japan ................................ 8-190963

[51] Int. Cl.$^6$ .................................................. H02G 3/14
[52] U.S. Cl. ............................ 174/66; 220/241; 439/718; 200/297
[58] Field of Search ................................ 174/48, 50, 57, 174/58, 60, 66; 439/718; 220/241, 315, 3.8, 4.02, 4.03, 3.92, 3.94; 200/296, 297

[56] References Cited

U.S. PATENT DOCUMENTS

| | | | |
|---|---|---|---|
| 3,784,728 | 1/1974 | De Bortoli et al. | 174/60 |
| 3,966,074 | 6/1976 | Hotchkiss et al. | 220/3.8 |
| 4,688,692 | 8/1987 | Humbs et al. | 220/3.8 |
| 4,771,910 | 9/1988 | Roy | 220/4.02 |
| 4,836,408 | 6/1989 | Roy | 220/4.02 |
| 5,129,536 | 7/1992 | Robinson | 220/211 |
| 5,405,035 | 4/1995 | Kato | 220/3.8 |
| 5,531,345 | 7/1996 | Nakamura et al. | 220/3.8 |
| 5,674,090 | 10/1997 | Sumida et al. | 439/540.1 |
| 5,700,163 | 12/1997 | Okabe | 439/596 |
| 5,702,021 | 12/1997 | Ito | 220/326 |

FOREIGN PATENT DOCUMENTS

| | | | |
|---|---|---|---|
| NR 243891 | 12/1965 | Australia | 174/66 X |
| 63-177080 | 11/1988 | Japan | H05K 5/00 |
| 3-20470 | 2/1991 | Japan | H05K 5/02 |

Primary Examiner—Bot L. Ledynh
Assistant Examiner—Dhiru R. Patel
Attorney, Agent, or Firm—Sughrue, Mion, Zinn, Macpeak & Seas, PLLC

[57] ABSTRACT

An electric connection box which has multiple functions to satisfy various types of equipment to be used. In the connection box, a plurality of first T-shaped ribs (14) of a T-shaped transverse cross-section are provided respectively at positions projected from a wall- portion (12) of a box body (2) by an amount equal to a base portion (14a), and a plurality of second T-shaped ribs (15), each having no base portion, are formed on the wall portion (12). A first fitting portion (32) for fitting on the first T-shaped rib (14) and a second fitting portion (42) for fitting on the second T-shaped rib (15) are formed in a cover (3) for fitting on the box body (2). When fitting the cover (3) on the box body (2), another part (51) is fitted on the first T-shaped rib (14) in an empty condition, and a selected one of the covers of different designs can be attached to the box body (2), which is a common part, and also the additional part can be mounted on the electric connection box.

12 Claims, 12 Drawing Sheets

FIG. 15
PRIOR ART

ELECTRIC CONNECTION BOX

BACKGROUND OF THE INVENTION

1. Field of the Invention

This invention relates to an electric connection box used for interconnecting wire harnesses installed in an automobile or for interconnecting electric equipments.

2. Related Art

Current, automobiles are provided with automatic devices, AV (audio/video) equipment and navigation devices. Therefore, the number of wiring members, including wire harnesses and connectors, as well as the number of fuses for safety purposes, has increased. In order to efficiently connect such wiring members and fuses and also to achieve the connection which allows for maintenance, an electric connection box as shown in FIGS. 12 and 13 has been used.

Figure 12:
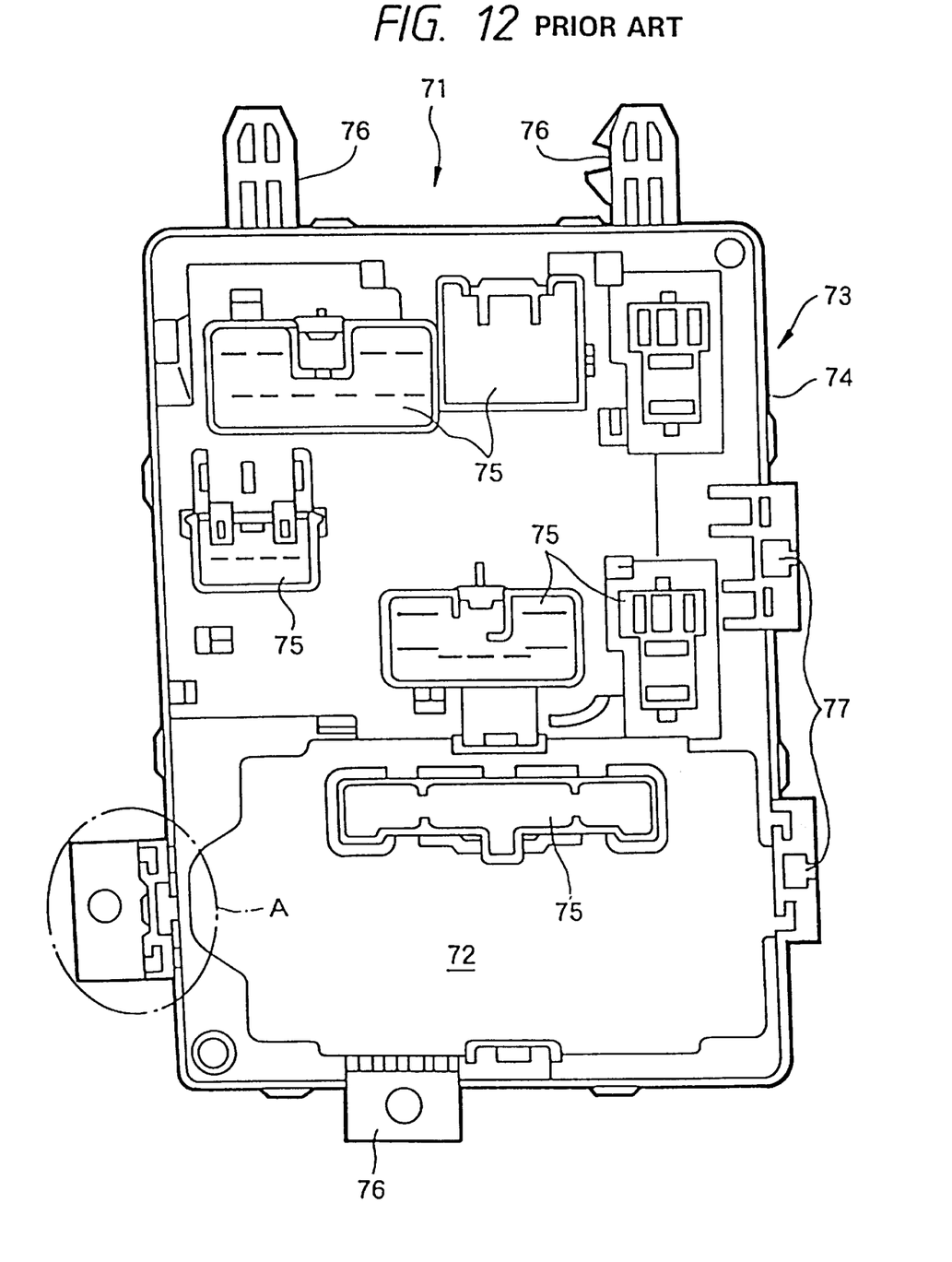
FIG. 12 is a plan view of a conventional electric connection box.
Figure 13:
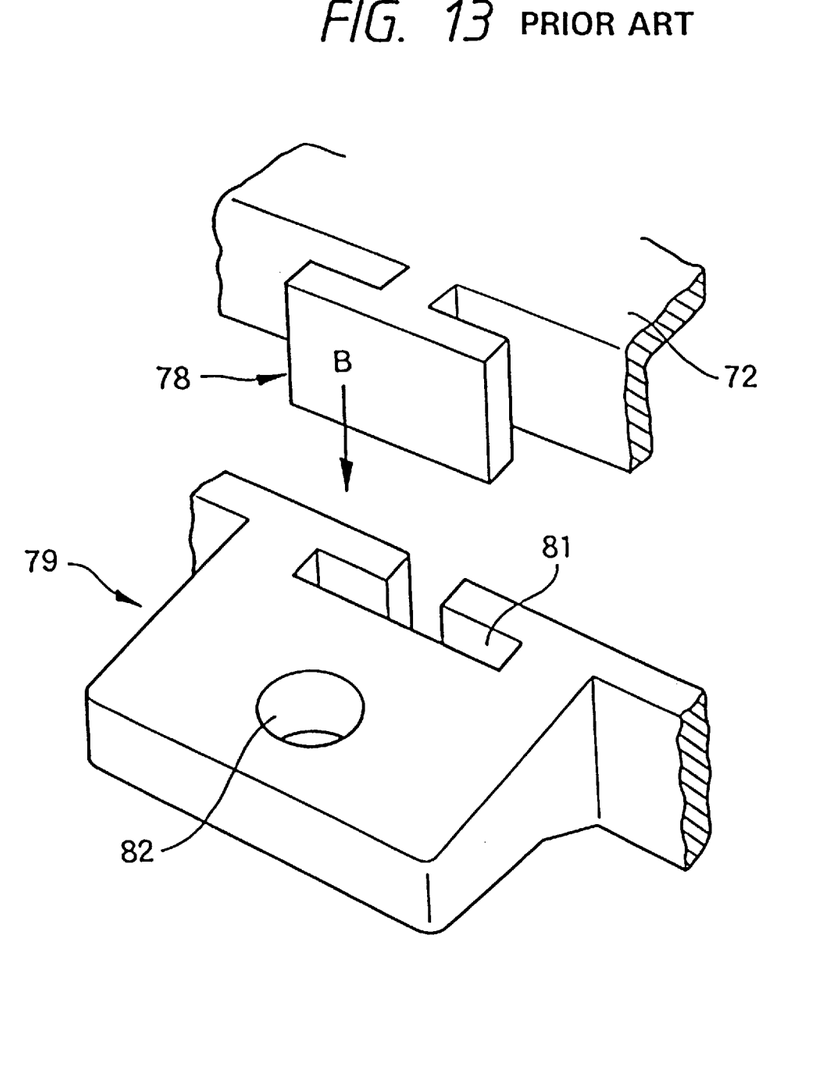
FIG. 13 is an enlarged, perspective view of an important portion A of FIG. 12 showing a fitting construction.

As shown in FIG. 12, the conventional electric connection box 71 includes a tray-like box body 72 fitted in a wall portion 74 formed on an outer peripheral edge of a cover 73. Various connector receptacles 75, to which connector terminals (not shown) are connected, are mounted on the box body 72.

Brackets 76 for fixing the cover 73 to a vehicle body frame or the like, and fixing frames 77, to which required parts are detachably fixed, are provided on the cover 73. A T-shaped rib 78 shown in FIG. 13 is formed at one end portion of the box body 72 indicated by A in FIG. 12.

A fitting member 79 is fixedly secured to the vehicle body frame (not shown) by a screw or the like. A fitting groove 81 of a T-shaped transverse cross-section, corresponding to the shape of the T-shaped rib 78, is formed in the fitting member 79, and the screw fastening to the frame is effected through a screw hole 82.

When fixing the electric connection box 71 to the vehicle body frame, the brackets 76 are fixedly secured to the vehicle body frame by screws, and also the T-shaped rib 78 is fitted into the fitting groove 81. As a result, the electric connection box 71 is fixed by the brackets 76 and is supported by the T-shaped rib 78. Therefore, the T-shaped rib 78 and the fitting member 79 function to prevent the electric connection box from being lifted and disengaged upon application of a force acting in a direction of arrow B.

Figure 14:
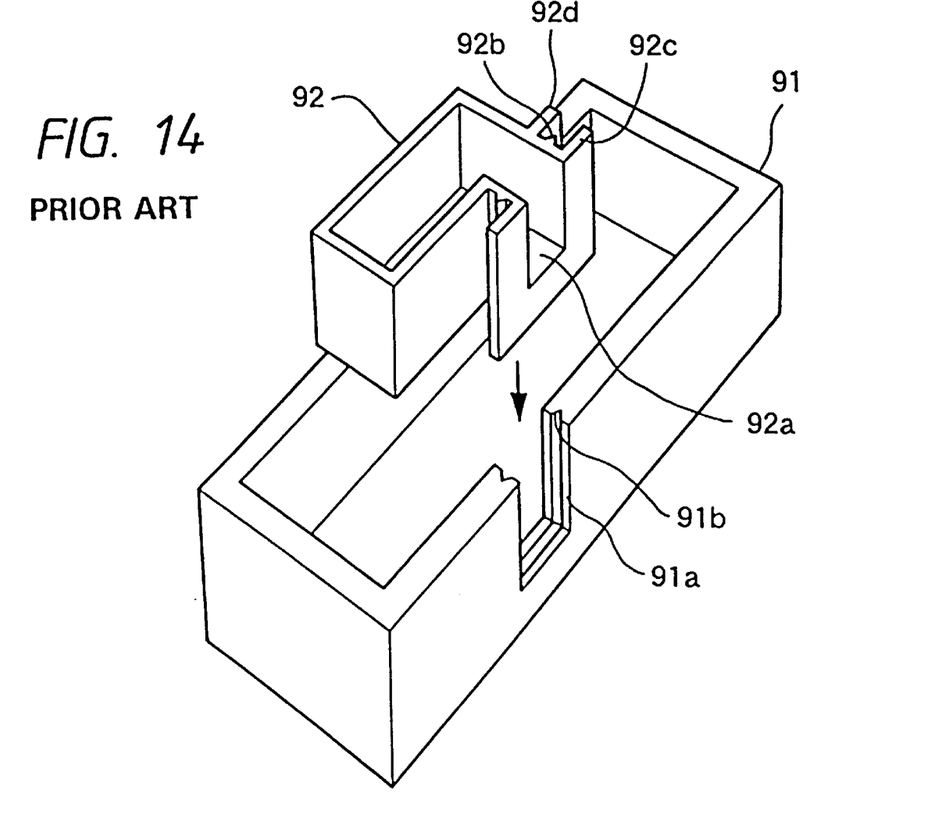
FIG. 14 is a perspective view of a conventional case.

Japanese Utility Model Unexamined Publication No. 63-177080 discloses a case for an electronic part used in a vehicle which is one example of an electric connection box. This box will be briefly described with reference to FIGS. 14 and 15. As shown in FIG. 14, an opening 9a is formed in a side wall of the case 91, and a drain hole portion 92a of a connector 92 is adapted to be fitted in the opening 9a. A groove 9b is formed in an edge of the opening 9a, and a protuberance 92b for fitting in the groove 9b is formed on the drain hole portion 92a.

Flange portions 92c and 92d for holding the side wall of the case 91 are formed in the drain hole portion 92a, and these flanges, together with the groove 9b and the protuberance 92b, increase the area of intimate contact of the drain hole portion 92a with the edge of the opening 91a.

With this construction in which the opening 9a and the drain hole portion 92a are provided, the connector can be provisionally attached to the case merely by fitting the drain hole portion 92a in the opening 9a. The area of intimate contact is increased as described above, and therefore even if a molding resin, poured into the casing 91, is lowered in viscosity as a result of a curing treatment such as a heating treatment, the molding resin will not leak. Therefore, the connector 92 can be provisionally attached to the case 91 in intimate contact therewith.

In the former electric connection box 71 shown in FIGS. 17 and 13, there is provided only the single function in which the electric connection box 71 is supported by the brackets, with the T-shaped rib 78 fitted in the fitting member 79.

Figure 15:
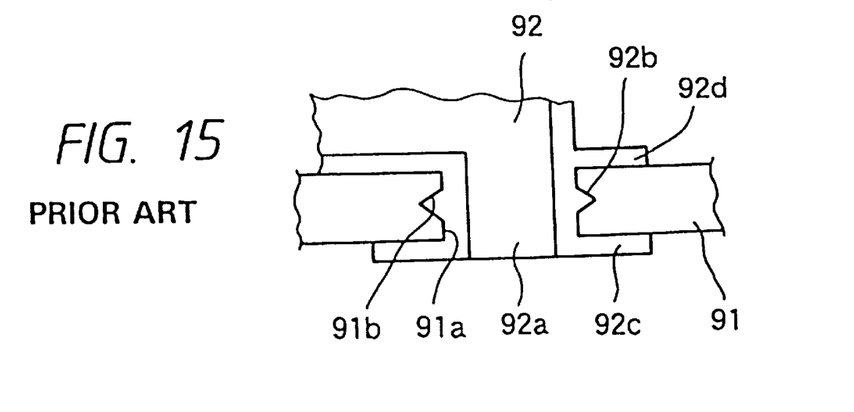
FIG. 15 is an enlarged, cross-sectional view of the fitting construction of FIG. 14.

In the latter case 91 shown in FIGS. 14 and 15, there is provided only the function in which the case 91 and the connector 92 are provisionally attached together, and other members cannot be fitted or provisionally attached.

Furthermore, in order to reduce the cost of automobiles, attempts have been made to reduce the number of the component parts and the number of the manufacturing steps, and in view of this, it has been desired to provide a construction in which, depending on a change of the specification of the electric connection box, the position of mounting of the electric connection box relative to the vehicle body frame can be changed, and parts can be added if necessary. In other words, it has been desired to provide an electric connection box of the common use type. However, not all of the conventional electric connection boxes can be easily formed into a common use design, and many boxes do not serve multiple functions to satisfy a change of the specification.

Accordingly, it is an object of this invention to provide an electric connection box which satisfies multiple functions associated with the various equipment to be used.

SUMMARY OF THE INVENTION

The above object has been achieved by an electric connection box described as follows.

The electric connection box comprises a box body including a body base plate portion for mounting desired parts thereon, and a body side wall portion provided around an outer periphery of the body base plate portion; and a cover including a cover base plate portion covering the body base plate portion of the box body, and a cover side wall portion closely fitted on the body side wall portion. According to the invention, there are provided a plurality of first T-shaped ribs each having a base portion projecting from an outer surface of the body side wall portion of the box body, an interconnecting portion extending outwardly from the base portion, a plate portion formed on a distal end of the interconnecting portion in opposed relation to the base portion, and fitting portions which are formed between the plate portion and the base portion, and are disposed respectively on opposite sides of the interconnecting portion. Additionally, there are provided a plurality of second T-shaped ribs each having an interconnecting portion projecting from the body side wall portion, a plate portion formed on a distal end of the interconnecting portion in opposed relation to the body side wall portion, and fitting portions which are formed between the plate portion and the body side wall portion, and are disposed respectively on opposite sides of the interconnecting portion. Further, a first fitting portion is formed in the cover, and is fitted on one of the plurality of first T-shaped ribs so that the other first T-shaped ribs are kept in an empty condition and a second fitting portion is formed in the cover, and is fitted on one of the plurality of second T-shaped ribs.

When fitting the box body and the cover together, a desired part is fitted on the first T-shaped rib in the empty condition, thereby combining the box body, the cover and the part together.

In the electric connection box of the above construction, that portion of the first T-shaped rib, which is projected from the body side wall portion of the box body by an amount equal to the thickness of the base portion thereof, has a T-shape, defined by the interconnecting portion and the plate portion, when viewed from the top. Therefore, regardless of the body side wall portion, the first T-shaped rib can be fitted in the first fitting portion, formed in the cover, when fitting the box body and the cover together.

When the box body is fitted in the cover, there is the first T-shaped rib which remains in the empty condition. Therefore regardless of the body side wall portion of the box body, the other part can be fitted on this first T-shaped rib. Therefore, in accordance with a change of the specification of, for example, an automobile, the cover, having the first fitting portion provided at a different position, can be fitted, or other part can be fitted, and the common part can be used.

DETAILED DESCRIPTION OF THE INVENTION

Figure 1:
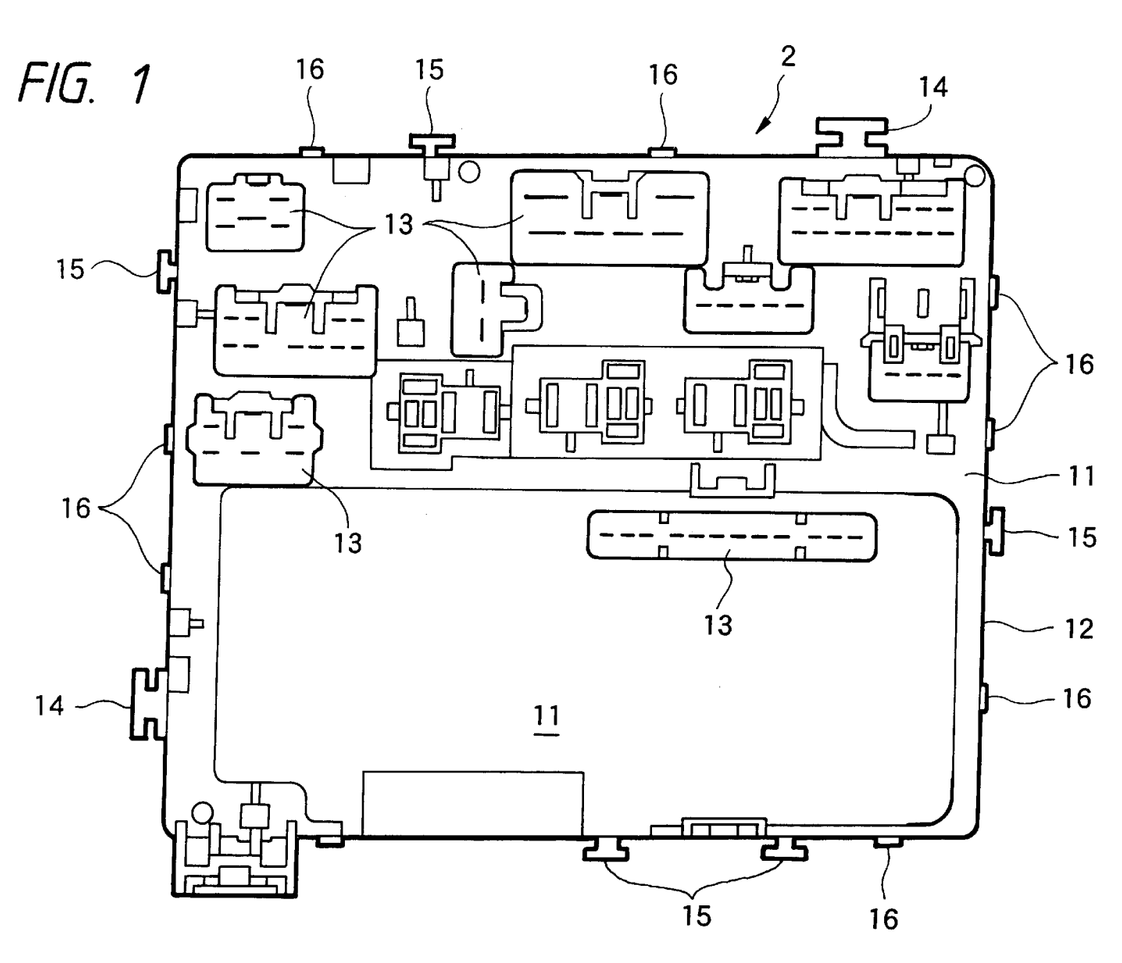
FIG. 1 is a plan view showing a box body of an electric connection box of the invention.
Figure 3:
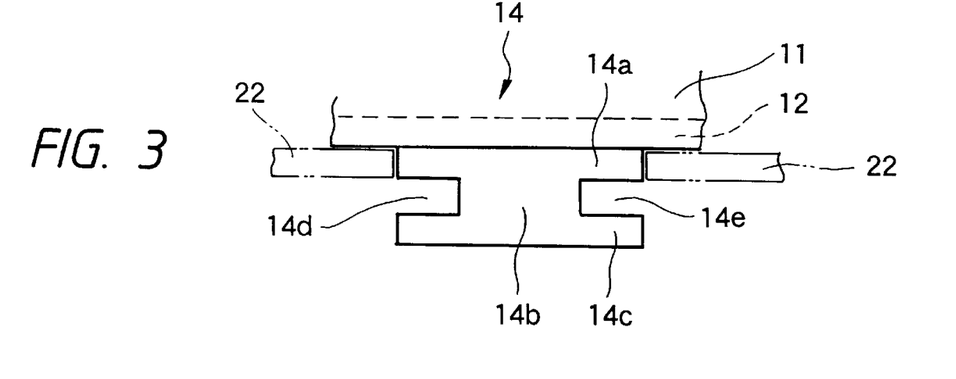
FIG. 3 is an enlarged, plan view showing the construction of a first T-shaped rib in FIG. 1.
Figure 4:
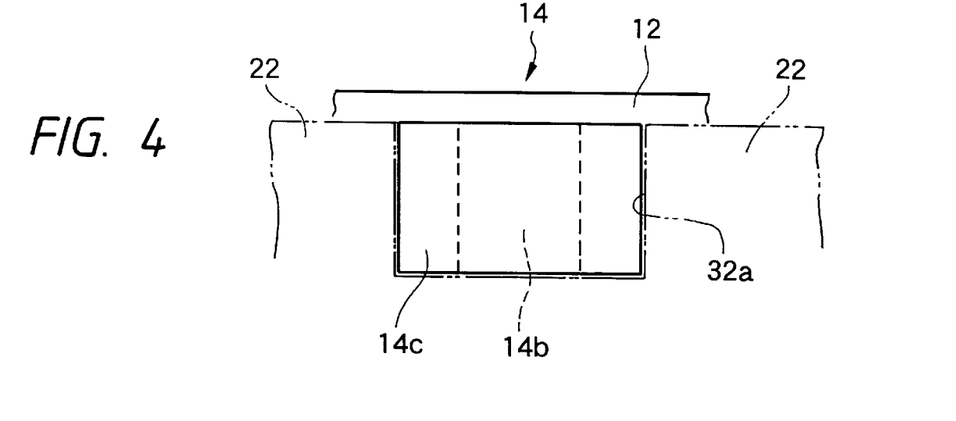
FIG. 4 is a front-elevational view of the first T-shaped rib of FIG. 3.
Figure 5:
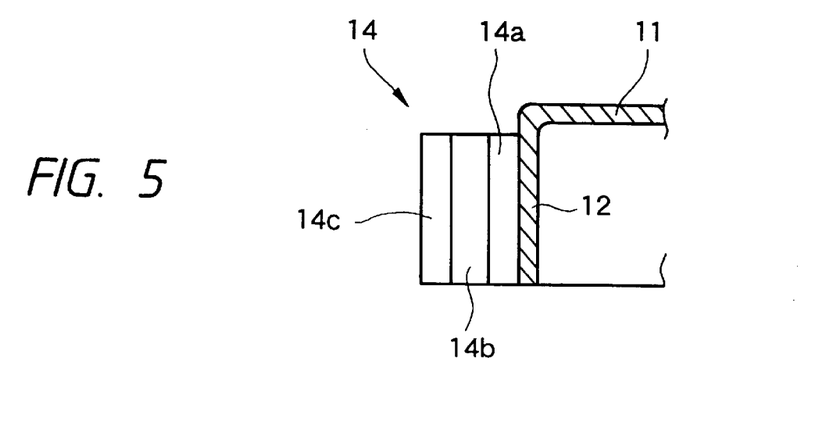
FIG. 5 is a cross-sectional view of the first T-shaped rib of FIG. 4.
Figure 6:
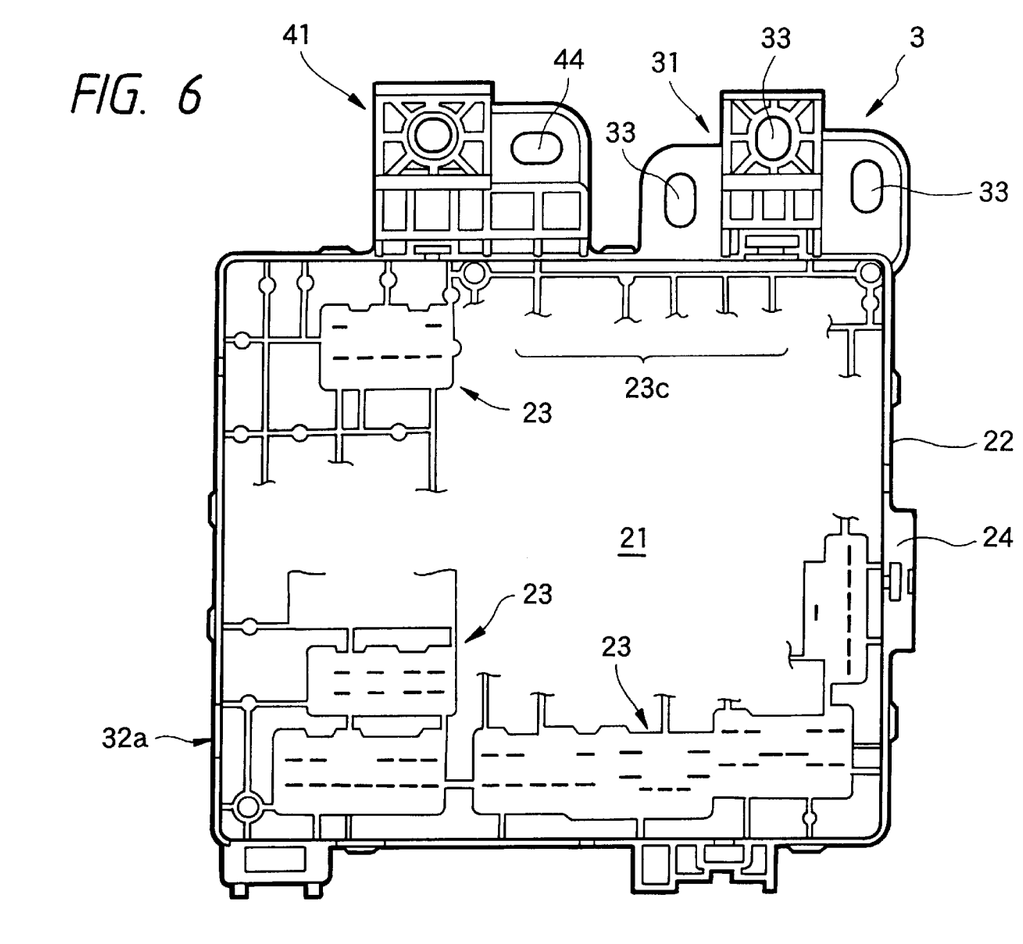
FIG. 6 is a plan view showing the construction of a cover to be connected to the box body of FIG. 1.
Figure 7:
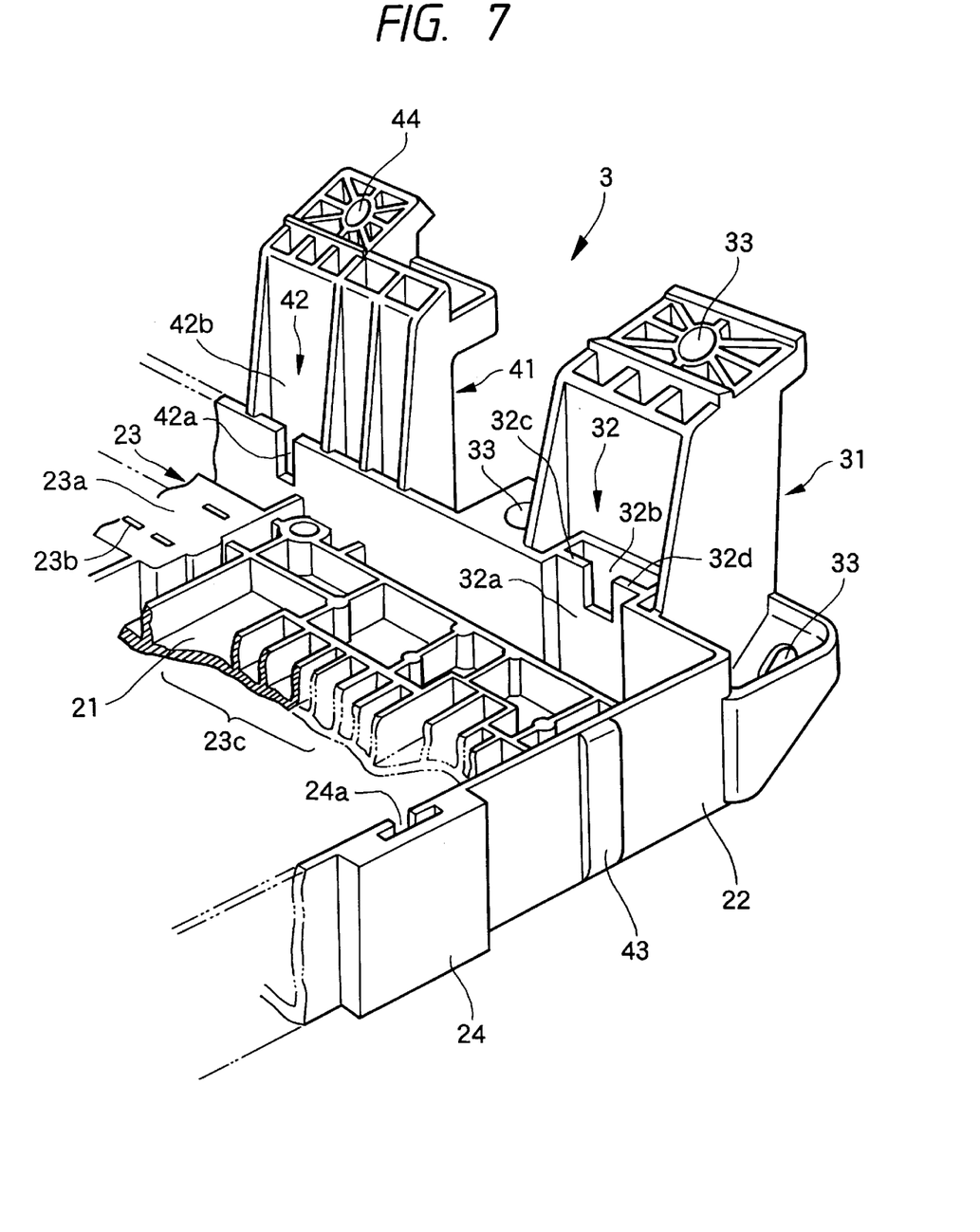
FIG. 7 is an enlarged, perspective view showing an important port n of the cover of FIG. 6.
Figure 8:
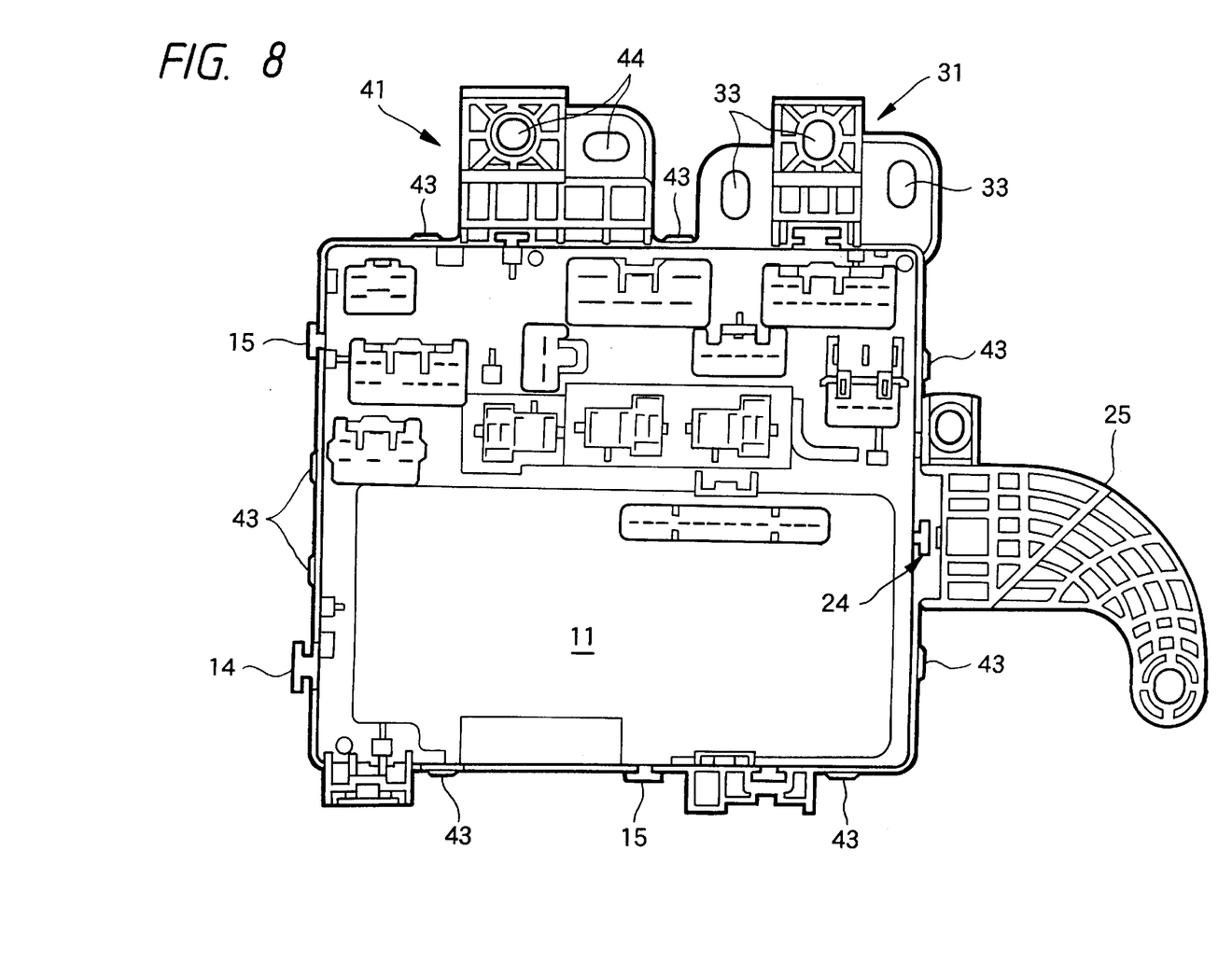
FIG. 8 is a plan view of the electric connection box, having the box body fitted in the cover.

A preferred embodiment of an electric connection box of the present invention will now be described with reference to FIGS. 1 to 7. FIG. 1 is a plan view showing the construction of a box body of the electric connection box, FIG. 2 is a perspective view showing an important portion of the box body, FIG. 3 is a plan view showing a fitting construction, FIG. 4 is a front-elevational view showing the fitting construction, FIG. 5 is a cross-sectional view showing the fitting construction, FIG. 6 is a plan view showing an important portion of a cover of the electric connection box, FIG. 7 is a perspective view showing an important portion of the cover, and FIG. 8 is a plan view showing a condition in which the box body is fitted in the cover.

The basic construction and operation of the preferred embodiment will be first described with reference to FIGS. 1–8, and then other embodiments of the invention will be described with reference to FIGS. 9 to 11.

The electric connection box 1 of this embodiment contains various parts (including connectors and fuses) used for connecting wire harnesses installed in an automobile, and comprises the box body 2, having the various parts mounted thereon, and the cover 3.

Figure 2:
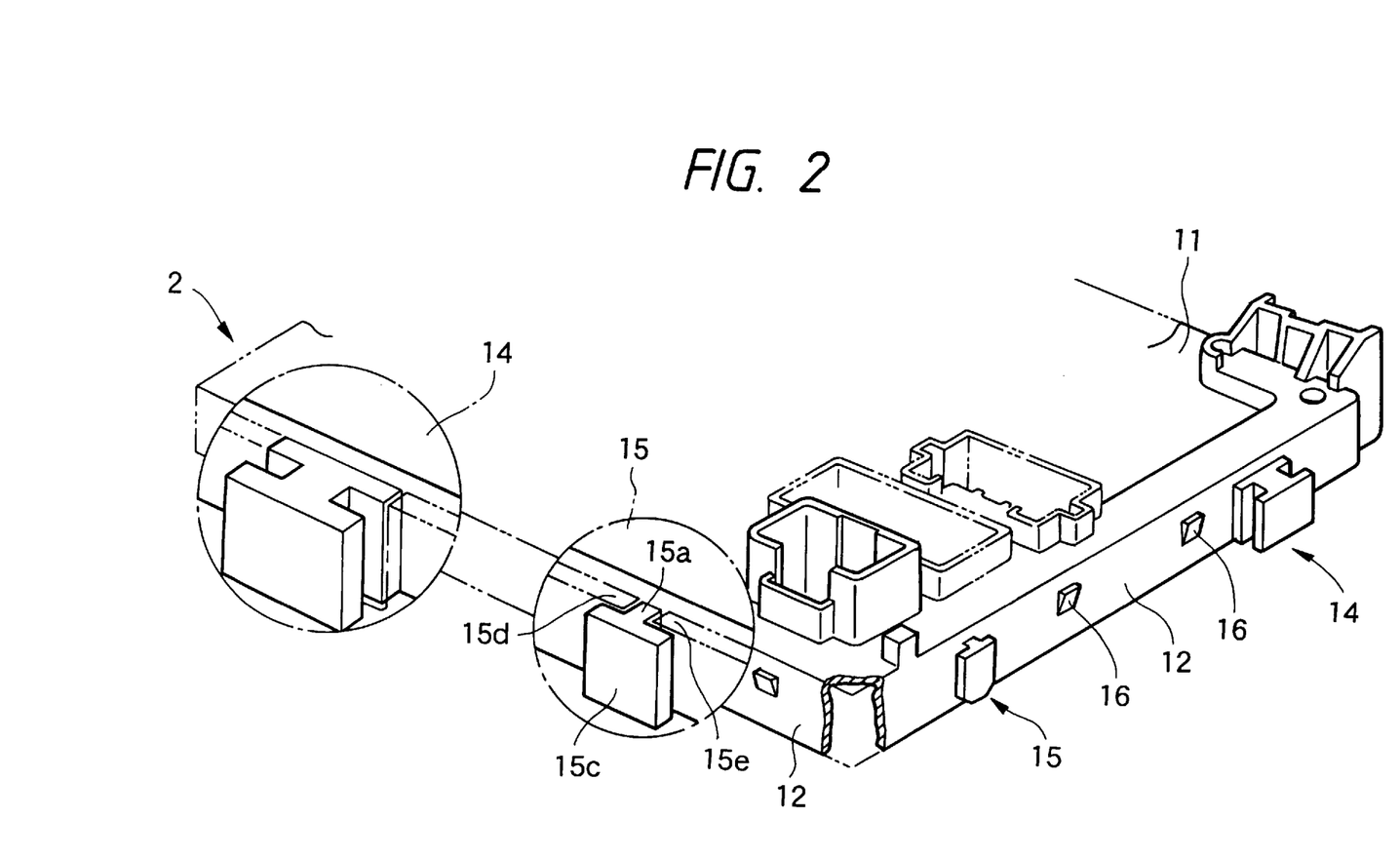
FIG. 2 is a perspective view showing an important portion of the box body of FIG. 1 on an enlarged scale.

The box body 2 is integrally molded of a synthetic resin, and has a generally square shape when viewed from the top as shown in FIG. 1, and also has a tray-like configuration defined by a body base plate portion 11 and a body side wall portion 12 as shown in FIG. 2. Guide frames 13, to which connectors are connected, respectively, are formed on the body base plate portion 11. The configurations, number and positions of the guide frames 13 are changed in accordance with a required specification, and part of these guide frames are indicated in solid lines and imaginary lines in FIG. 2.

First T-shaped ribs 14, second T-shaped ribs 15 and retaining pawls 16 are integrally formed on an outer surface of the body side wall portion 12. As shown on an enlarged scale in FIGS. 3 to 5, the first T-shaped rib 14 has a base portion 14a projecting from the body side wall portion 12, an interconnecting portion 14b formed on a central portion of the base portion 14a, and a plate portion 14c formed on a distal end (or outer surface) of the interconnecting portion 14b. Fitting portions 14d and 14e are formed by the base portion 14a, the interconnecting portion 14b and the plate portion 14c.

As shown in FIG. 2, the second T-shaped rib 15 has an interconnecting portion 15a formed on the body side wall portion 12, and a plate portion 15c formed on this interconnecting portion. Fitting portions 15d and 15e are formed by the body side wall portion 12, the interconnecting portion 15a and the plate portion 15b. The difference between the first T-shaped rib 14 and the second T-shaped rib 15 is that the second T-shaped rib 15 does not have a base portion, and is generally smaller than the first T-shaped rib 14.

The cover 3 has a generally square shape when viewed from the top as shown in FIG. 6, and includes a cover base plate portion 21, a cover side wall portion 22, and flange portions 31 and 41, as shown on an enlarged scale in FIG. 7. The cover 3 is integrally molded. Bottom portions 23a of guide frames 23 (into which connectors are inserted from the reverse side), insertion holes 23b for connector terminals, reinforcement ribs 23c and so on are formed on the cover base plate portion 21.

The brackets 31 and 41 for fixing the cover 3, for example, to a vehicle body-frame of an automobile, as well as a fixing frame 24 to which a bracket can be detachably fixed, are formed on an outer surface of the cover side wall portion 22. A fitting groove 24a of a T-shaped transverse cross-section is formed in the fixing frame 24, and is so sized as to fittingly receive the second T-shaped rib 15.

The configuration and size of the brackets 31 and 41 are changed in accordance with the fixing construction of the electric connection box 1, and a first fitting portion 32 for fitting on the first T-shaped rib 14 is formed in the inner side of the bracket 31.

The first fitting portion 32 has a base portion fitting portion 32a formed in the cover side wall portion 22 for receiving the base portion 14a, a plate fitting portion 32b for receiving the plate portion 14c, and plate-like fitting members 32c and 32d for fitting, respectively, in the fitting portions 14d and 14e. As shown in FIGS. 3 and 4, the base portion fitting portion 32a corresponds in size to the base portion 14a.

The bracket 31 is fixedly secured to the vehicle body frame by screws passing respectively through screw holes 33, as shown in FIG. 6.

A second fitting portion 42 for fitting on the second T-shaped rib 15 is formed in the inner side of the bracket 41. The second fitting portion 42 has an interconnecting portion fitting portion 42a formed in the cover side wall portion 22 so as to receive the interconnecting portion 15a, and a plate fitting portion 42b for receiving the plate portion 15b. The bracket 41 is fixedly secured to the vehicle body frame or the like by a screw passing through a screw hole 44.

Next, the fitting of the box body 2 in the cover 3 will be described. The outer size of the body side wall portion 12 of the box body 2 is so determined that the body side wall portion 12 can be fitted inside the cover side wall portion 22 of the cover 3. When fitting the box body 2 in the cover 3, the first T-shaped rib 14 is registered with the first fitting portion 32, and the second T-shaped rib 15 is registered with the second fitting portion 42 as shown in FIGS. 1 and 6. In this condition the box body 2 is pushed into the cover 3. At this time, the cover side wall portion 22 of the cover 3 is temporarily elastically deformed outwardly by the retaining pawls 16 formed on the outer surface of the body side wall portion 12.

As shown in FIG. 7, vertically-extending protuberances 43 are formed on the outer surface of the cover side wall portion 22, and a retaining groove (not shown) for retaining the associated retaining pawl 16 is formed in the inner side of each of the protuberances 43. When the box body 2 is pushed into the cover, the retaining pawls 16 are fitted respectively into the retaining grooves, so that the cover side wall portion 22 is restored into its original configuration, thereby preventing the box body 2 from being disengaged from the cover.

When the box body 2 is pushed into the cover, the first T-shaped rib 14 is fitted into the first fitting portion 32, and also the second T-shaped rib 15 is fitted into the second fitting portion 42, as shown in FIG. 8.

The first T-shaped rib 14, formed on the lower portion of the left side of the box body (FIG. 1), is fitted in a base portion fitting portion 32a shown in FIG. 6. In the cover structure of this embodiment, however, neither a bracket nor any first fitting portion is provided in this portion of the cover, so that the interconnecting portion 14b, the plate portion 14c and the fitting portions 14d and 14e project outwardly from the cover side wall portion 22; that is, they are disposed in an empty condition, as shown in FIGS. 3 and 8.

Those second T-shaped ribs 15, i.e., other than the rib 15 corresponding to the second fitting portion 42, are fitted respectively in interconnecting portion fitting portions 42a formed in the cover side wall portion 22, as shown in FIG. 8. Therefore, the entire box body 2 is closely fitted in the cover side wall portion 22 of the cover 3, and is prevented from being disengaged therefrom since the retaining pawls 16 are retained respectively by the protuberances 43.

In this fitted condition, it is to be noted that the first T-shaped rib 14 has the plate portion 14c formed on the base portion 14a through the interconnecting portion 14b as shown in FIG. 3, and that the first T-shaped rib 14 is greater in size and mechanical strength than the second T-shaped rib 15.

As shown in FIG. 6, the first fitting portion 32 is formed in the bracket 31 to be fixed directly to the vehicle body frame or the like. Further, the first T-shaped rib is designed so that the interconnecting portion 14b and the plate portion 14c of the first T-shaped rib 14 project outwardly from the cover side wall portion 22 of the cover 3, as shown in FIGS. 3 and 7, and the fitting members 32c and 32d of the first fitting portion 32 are fitted respectively in the fitting portions 14d and 14e. Therefore, part of the box body 2 is fitted in the bracket 31 to be fixed directly to the vehicle body frame or the like, so that the box body 2 is prevented from being lifted.

In this manner, the box body 2 and the cover 3 are connected together as shown in FIG. 8, and an independent bracket 25 is fixed by the use of the fixing frame 24. Unlike the brackets 31 and 41, this independent bracket 25 is not formed integrally with the cover 3, but is a separate member, and is attached in accordance with a mode of use of the electric connection box 1.

The first T-shaped rib 14, formed on the lower portion of the left side of the box body (FIG. 8), is in an unused condition, and is utilized for achieving the common use design of the electric connection box, as described below.

Next, another embodiment of the invention will be described with reference to FIG. 9. This embodiment is directed to the manner of use of the first T-shaped rib 14. FIG. 9 is a plan view showing the box body 2 and the cover 3 connected together.

Figure 9:
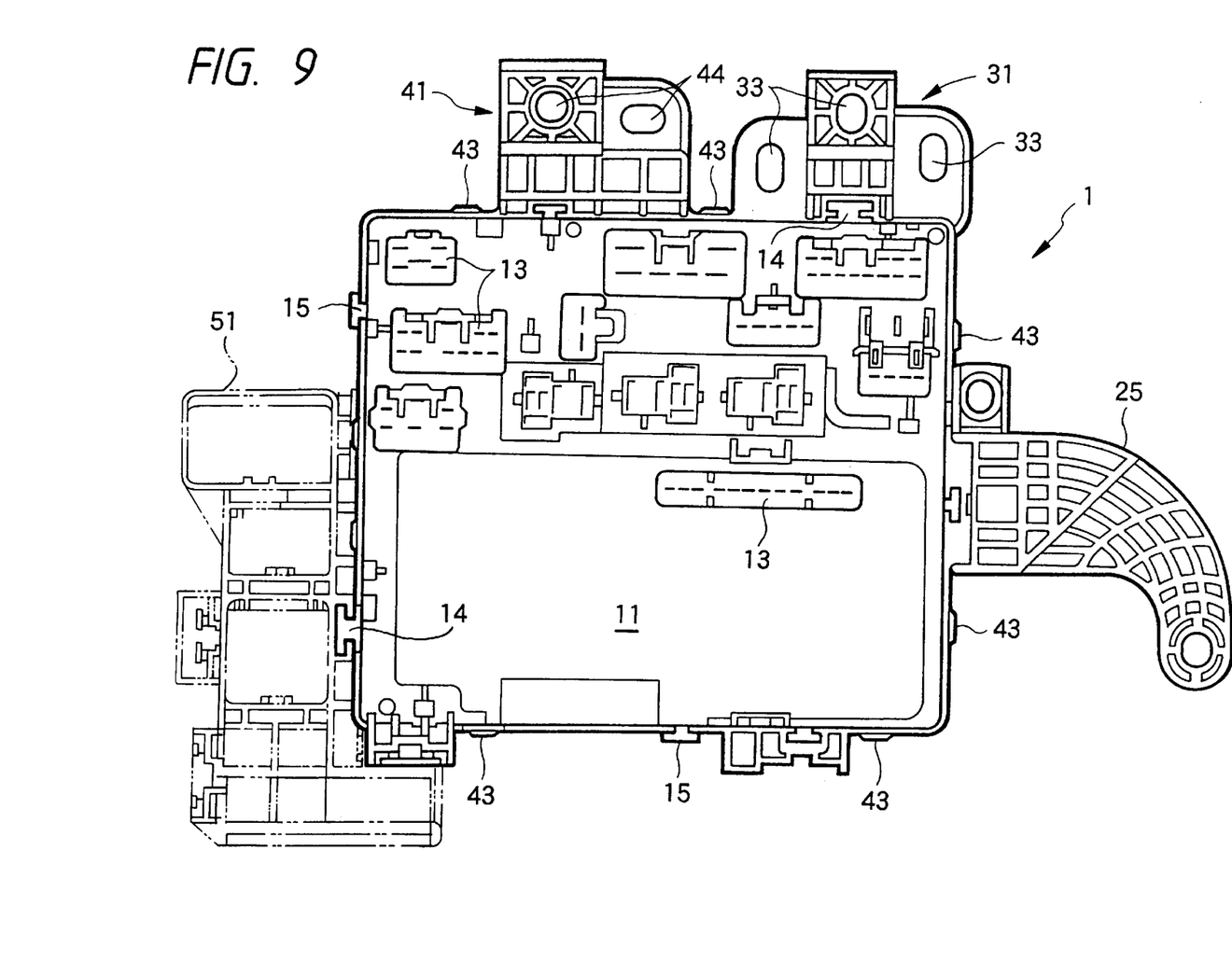
FIG. 9 is a plan view showing the electric connection box of FIG. 8 having other part mounted thereon.

Another part 51 is attached to the first T-shaped rib 14 in the unused condition as shown in phantom in FIG. 9. This part 51 could include, for example, an additional connector terminal, a fuse holder, or a terminal plate which is selectively attached. Like the previous embodiment, the first fitting portion 32 is provided at the position corresponding to the first T-shaped rib 14, and the first T-shaped rib 14 is fitted in this first fitting portion 32. Thus, the box body 2, the cover 3 and the additional part 51 are combined together. Since the first T-shaped rib 14 is of a firm construction, even if the weight of the additional part 51 is applied as a load to the first T-shaped rib 14, this rib 14 will not be easily damaged or broken.

With the addition of the part 51, the functions of the electric connection box 1 can be increased in accordance with the specification of an automobile, using the electric connection box 1, without changing the construction of the box body 2. Therefore, although electric connection boxes of different designs have heretofore been used in accordance with the specification of an automobile, the electric connection box 1 of this embodiment can be used as a common part, and the number of the component parts and the number of the manufacturing steps can be reduced, and besides the maintenance can be effected easily.

Next, a further embodiment of the invention will be described with reference to FIGS. 10 and 11. FIG. 10 is a plan view of an electric connection box 1, and FIG. 11 is a plan view of the electric connection box 1 having other part attached thereto. In this embodiment, also, the box body 2 is the same as the box body of the above embodiment, while the cover 3 is changed in accordance with the purpose of use. More specifically, in this embodiment, a bracket 62 is provided on that portion of the cover 3 corresponding to a first T-shaped rib 14 formed at a lower portion of the left side of the box body 2 (FIGS. 10 and 11), and a first fitting portion similar to fitting portion 32 of bracket 31, is formed in this bracket 62. A bracket 63 is provided on that portion of the cover 3 corresponding to a second T-shaped rib 15 formed at an upper portion of the left side of the box body 2 (FIGS. 10 and 11), and a second fitting portion similar to fitting portion 42 of bracket 41, is formed in this bracket 63.

Figure 10:
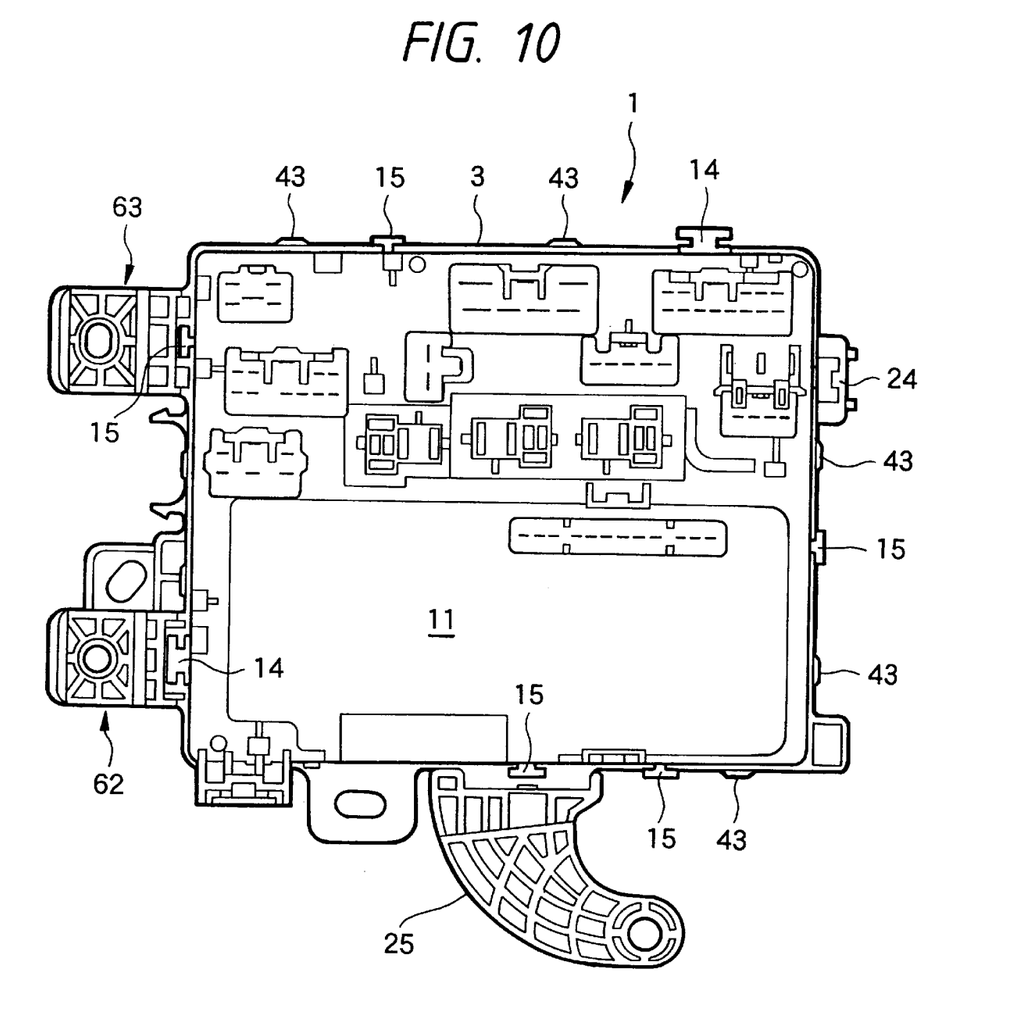
FIG. 10 is a plan view of an electric connection box having a slightly-modified cover fitted on the box body.
Figure 11:
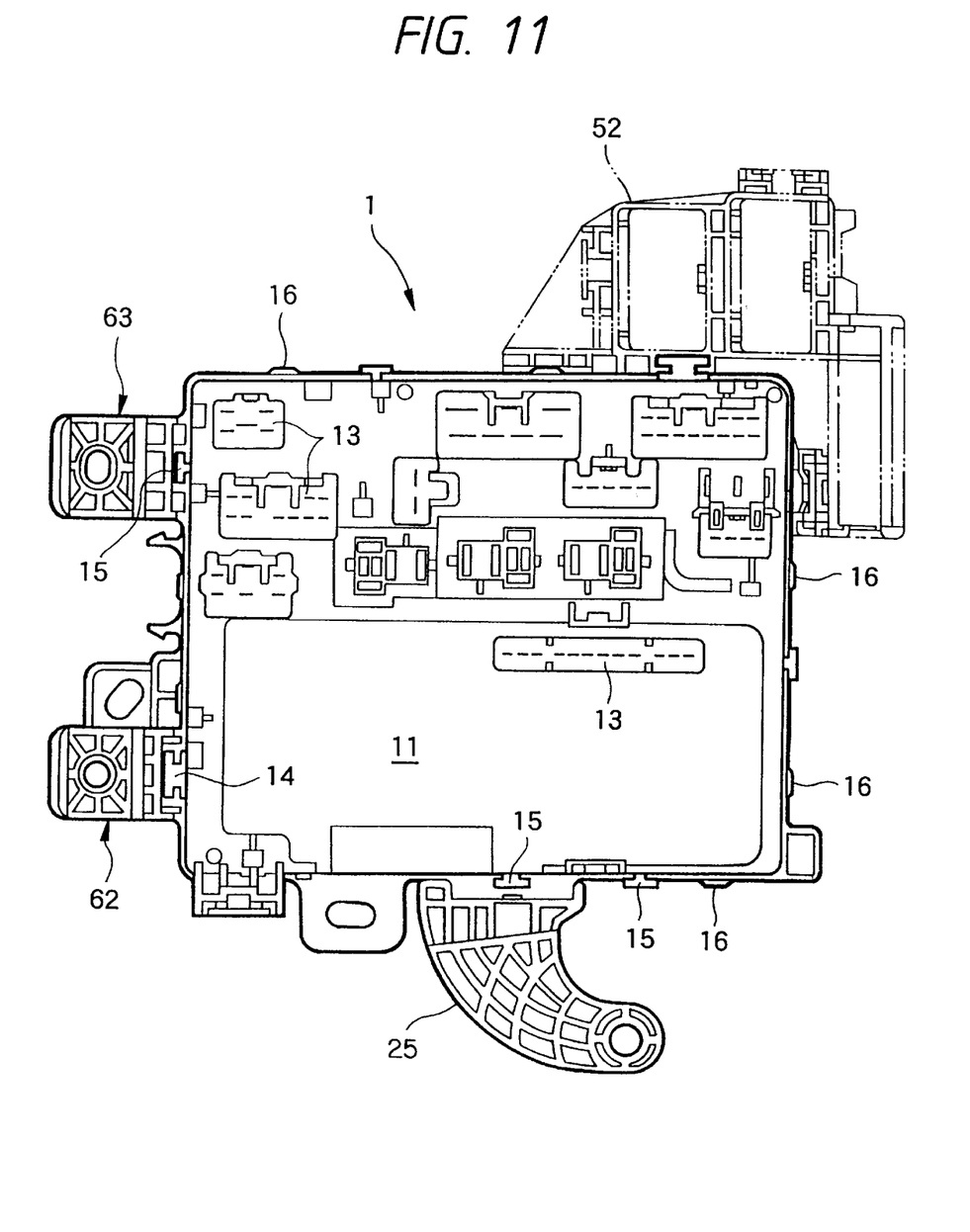
FIG. 11 is a plan view showing the electric connection box of FIG. 10 having other part mounted thereon.

The difference between the cover 3 of this embodiment and the cover 3 of the above embodiments, is that the cover 3 of FIGS. 10 and 11 is not provided with the bracket 31 provided on the upper side of the cover 3 of FIGS. 1 to 9. Further, a bracket 25 is removably attached to the second T-shaped rib 15 provided at a generally central portion of the lower side of the cover 3 (FIGS. 10 and 11).

When the cover 3 of this construction is pushed into the box body 2, the box body 2 is fitted into a cover side wall portion 22 of the cover 3, and at the same time the first T-shaped rib 14 is fitted into the first fitting portion 32, and the second T-shaped rib 15 is fitted into the second fitting portion 42.

Like the brackets 31 and 41, the brackets 62 and 63 of this embodiment are fixedly secured to a chassis or the like.

In the electric connection box 1 shown in FIG. 11, a first T-shaped rib 14 and a second T-shaped rib 15, which are provided on the upper side of the box body 2, are in an empty or unused condition. However, utilizing the first T-shaped rib 14, the second T-shaped rib 15 and a fixing frame 24, other part 52 can be attached to the box body as shown in phantom in FIG. 11. Other part 52 is a connector block, such as an additional connector terminal, a fuse holder, or a terminal plate is selectively attached.

With the addition of the part 52, the functions of the electric connection box 1 can be increased in accordance with the specification of an automobile, using the electric connection box 1, without modifying the construction of the box body 2. Therefore, although electric connection boxes of different designs have heretofore been used in accordance with the specification of an automobile, the electric connection box 1 of the above embodiments can be used as a common part for the four modes of use, and the number of the component parts and the number of the manufacturing steps can be reduced, and besides the maintenance can be effected easily. Thus, the various advantageous effects can be achieved.

By way of summary, in the electric connection box, there are provided a plurality of first T-shaped ribs each having a base portion projecting from an outer surface of the body side wall portion of the box body, an interconnecting portion extending outwardly from the base portion, a plate portion formed on a distal end of the interconnecting portion in opposed relation to the base portion, and fitting portions which are formed between the plate portion and the base portion, and are disposed respectively on opposite sides of the interconnecting portion, and there are provided a plurality of second T-shaped ribs each having an interconnecting portion projecting from the body side wall portion, a plate portion formed on a distal end of the interconnecting portion in opposed relation to the body side wall portion, and fitting portions which are formed between the plate portion and the body side wall portion, and are disposed respectively on opposite sides of the interconnecting portion, and a first fitting portion is formed in the cover, and is fitted on one of the plurality of first T-shaped ribs so that the other first T-shaped ribs are kept in an empty condition, and a second fitting portion is formed in the cover, and is fitted on one of the plurality of second T-shaped ribs.

When fitting the box body and the cover together, a desired other part is fitted on the first T-shaped rib in the empty condition, thereby combining the box body, the cover and the other part together.

Therefore, the box body is of the common type, and by exchanging the cover, the position of the first T-shaped rib in the empty condition can be freely changed, and the desired part can be added by the use of this first T-shaped rib. Therefore, there is no need to prepare electric connection boxes of different standards in accordance with kinds of automobiles, but the electric connection box is the common, interchangeable part, and the number of the component parts, the number of the manufacturing steps can be reduced, and the cost of the electric equipment, using the electric connection box, can be reduced.

What is claimed is:

1. An electric connection box, comprising:
    a box body including a body base plate portion for mounting desired parts thereon and a body side wall portion provided around an outer periphery of said body base plate portion;
    a cover including a cover base plate portion covering said body base plate portion of said box body and a cover side wall portion closely fitted on said body side wall portion;
    a plurality of first T-shaped ribs projecting from said body side wall portion of said box body, each of said T-shape first ribs including a base portion connected to said body side wall portion, an interconnecting portion extending outwardly from said base portion, and a plate portion formed on a distal end of said interconnecting portion in opposed relation to said base portion, said base portion and said plate portion defining fitting grooves formed therebetween on opposite sides of said interconnecting portion;
    a plurality of second T-shaped ribs projecting from said body side wall portion, said second T-shaped ribs each including an interconnecting portion projecting from said body side wall portion, and a plate portion formed on a distal end of said interconnecting portion in opposed relation to said body side wall portion, said plate portion and said body side wall portion defining fitting grooves therebetween on opposite sides of said interconnecting portion;
    a first fitting portion formed in said cover and being engageable with one of said plurality of first T-shaped ribs such that an other of said first T-shaped ribs is kept in an empty condition; and
    a second fitting portion formed in said cover and being engageable with one of said plurality of second T-shaped ribs.

2. An electric connection box according to claim 1, wherein said other of said first T-shaped ribs is adapted to receive a desired other part, thereby combining said box body, said cover and said other part together.

3. An electric connection box according to claim 2, wherein said desired other part comprises one of a connector terminal, a fuse holder and a terminal plate.

4. An electric connection box according to claim 1, wherein said cover includes a bracket for mounting said electric connection box.

5. An electric connection box according to claim 4, wherein said first fitting portion is formed in said bracket.

6. An electric connection box according to claim 2, wherein said desired other part is a connector block.

7. An electric connection box, comprising:
    a box body including a body base plate portion for mounting desired parts thereon and a body side wall portion provided around an outer periphery of said body base plate portion;
    a cover including a cover base plate portion covering said body base plate portion of said box body and a cover side wall portion closely fitted on said body side wall portion;
    a plurality of first T-shaped ribs projecting from said body side wall portion of said box body;

a plurality of second T-shaped ribs projecting from said body side wall portion;

a first fitting portion formed in said cover and being engageable with one of said plurality of first T-shaped ribs such that an other of said first T-shaped ribs is kept in an empty condition; and a second fitting portion formed in said cover and being engageable with one of said plurality of second T-shaped ribs.

8. An electric connection box according to claim 7, wherein said other of said first T-shaped ribs is adapted to receive a desired other part, thereby combining said box body, said cover and said other part together.

9. An electric connection box according to claim 8, wherein said desired other part comprises one of a connector terminal, a fuse holder and a terminal plate.

10. An electric connection box according to claim 7, wherein said cover includes a bracket for mounting said electric connection box.

11. An electric connection box according to claim 10, wherein said first fitting portion is formed in said bracket.

12. An electric connection box according to claim 8, wherein said desired other part is a connector block.

* * * * *